(12) United States Patent
Farnworth

(10) Patent No.: US 6,544,902 B1
(45) Date of Patent: Apr. 8, 2003

(54) ENERGY BEAM PATTERNING OF PROTECTIVE LAYERS FOR SEMICONDUCTOR DEVICES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,340

(22) Filed: Aug. 31, 2000

Related U.S. Application Data

(63) Continuation-in-part of application No. 09/259,142, filed on Feb. 26, 1999, and a continuation-in-part of application No. 09/259,143, filed on Feb. 26, 1999.

(51) Int. Cl.[7] .......................... H01L 21/31; H01L 21/469
(52) U.S. Cl. ........................... 438/781; 438/82; 438/99; 438/707; 438/780; 438/781; 438/788; 257/40; 430/311; 430/313
(58) Field of Search ..................... 438/166, 699, 438/707, 780–81, 788, 82, 99; 257/40, 430, 311–315

(56) References Cited

U.S. PATENT DOCUMENTS

| | | | | |
|---|---|---|---|---|
| 4,115,120 A | * | 9/1978 | Dyer et al. ................... 96/36.2 |
| 4,675,235 A | * | 6/1987 | Wu .............................. 428/363 |
| 4,680,855 A | * | 7/1987 | Yamazaki et al. ............. 29/583 |
| 4,745,045 A | * | 5/1988 | Fredericks et al. ........... 430/315 |
| 4,910,122 A | * | 3/1990 | Arnold et al. ................ 430/313 |
| 4,945,204 A | | 7/1990 | Nakamura et al. |
| 5,173,220 A | | 12/1992 | Reiff et al. |
| 5,198,326 A | * | 3/1993 | Hashimoto et al. ......... 430/296 |
| 5,264,061 A | * | 11/1993 | Juskey et al. ................ 156/214 |
| 5,372,914 A | * | 12/1994 | Naito et al. .................. 430/296 |
| 5,445,923 A | | 8/1995 | Takahashi et al. |
| 5,447,598 A | | 9/1995 | Mihara et al. |
| 5,484,314 A | | 1/1996 | Farnworth |
| 5,612,573 A | * | 3/1997 | Lewis et al. ................. 257/758 |
| 5,705,117 A | * | 1/1998 | O'Connor et al. .......... 264/401 |
| 5,712,192 A | * | 1/1998 | Lewis et al. ................. 437/182 |
| 5,733,711 A | | 3/1998 | Juengling |
| 5,838,361 A | | 11/1998 | Corbett |
| 5,849,435 A | | 12/1998 | Akram et al. |
| 5,851,734 A | | 12/1998 | Pierrat |
| 5,928,767 A | * | 7/1999 | Gebhardt et al. ............ 428/209 |
| 5,937,270 A | | 8/1999 | Canella |
| 5,940,277 A | | 8/1999 | Farnworth et al. |
| 5,979,048 A | * | 11/1999 | Nishikawa et al. ........... 29/885 |
| 5,985,377 A | | 11/1999 | Corbett |
| 5,998,228 A | * | 12/1999 | Eldridge et al. .............. 438/15 |
| 6,159,537 A | * | 12/2000 | Crandall ................... 427/163.4 |
| 6,168,968 B1 | * | 1/2001 | Umemoto et al. ............ 438/96 |

FOREIGN PATENT DOCUMENTS

| | | | | |
|---|---|---|---|---|
| EP | 385736 | * | 9/1990 | ............ H01I/23/29 |
| EP | 800208 | * | 10/1997 | ......... H01L/23/538 |

\* cited by examiner

*Primary Examiner*—Matthew Smith
*Assistant Examiner*—Granvill D Lee, Jr.
(74) *Attorney, Agent, or Firm*—TraskBritt

(57) ABSTRACT

A method of creating a resist or other protective material pattern on a substrate using traversal of a focused energy beam such as a laser beam in a selected pattern over the substrate to cure a resin polymer, other resist material or other protective layer disposed over the substrate. The substrate may comprise a semiconductor wafer or other large-scale substrate comprising a large plurality of semiconductor die locations, may comprise a partial wafer or substrate, or a singulated semiconductor die.

25 Claims, 3 Drawing Sheets

ENERGY BEAM PATTERNING OF PROTECTIVE LAYERS FOR SEMICONDUCTOR DEVICES

RELATED APPLICATIONS

This application is a continuation-in-part of U.S. patent applications Ser. Nos. 09/259,142 and 09/259,143, each filed Feb. 26, 1999, pending. The disclosure of each of the foregoing applications, which applications are assigned to the assignee of the present invention, is hereby incorporated herein by reference in its entirety.

BACKGROUND OF THE INVENTION

1. Field of the Invention

The present invention relates generally to the formation of patterns for resists and other protective materials employed on semiconductor devices. More specifically, the present invention relates to a method for forming patterns in a resist or other protective material by traversing an energy beam thereover instead of exposing the material to radiant energy through a mask.

2. State of the Art

The manufacture of semiconductor devices routinely involves multiple masking steps. For example, resist material, also commonly termed "photo resist" material due to its light sensitivity, is deposited on a semiconductor substrate and patterned by exposing a portion of the resist material to ultraviolet light through a mask which defines a positive or negative resist pattern. In the case of a positive resist pattern, the exposed resist material is chemically modified and/or degraded by the ultraviolet light such that the exposed resist material portions may be removed by conventional developing techniques as known in the art. In the case of a negative resist pattern, the exposed resist material is chemically modified to harden or set by exposure to the ultraviolet light such that the exposed resist material portions are not degraded by conventional developing techniques, but instead the unexposed resist material may be removed by developing, resulting in a resist pattern on the semiconductor matching the mask pattern. Suitable additional procedures, such as deposition, etching, or the like, are carried out after the resist is patterned to form desired features of a semiconductor device. The resist material is then removed, leaving the desired semiconductor features, and manufacturing continues. The masking process may be repeated as desired with differently patterned masks in conjunction with associated material deposition and removal steps until all of the desired features of the semiconductor have been formed.

FIGS. 1 and 2 illustrate an exemplary process of creating a resist pattern on a semiconductor device. FIG. 1 illustrates a semiconductor device 100 covered by a layer of resist material 110. A mask 120 having both radiation-transparent portions 122 and radiation-opaque portions 124 is aligned over the resist material 110. Electromagnetic radiation 130 (such as ultraviolet light, x-rays or visible light) is directed perpendicularly toward the mask 120 and passes through the transparent portions 122 of the mask 120 to be absorbed by the resist material 110. Those portions of the electromagnetic radiation 130 meeting the opaque portions 124 of the mask 120 are either reflected or absorbed by the material of mask 120. The resist material 110 exposed to the electromagnetic radiation 130 through transparent portions 122 of mask 120 undergoes a chemical change, as previously discussed above (depending upon whether the resist is of the positive or negative type), to define a pattern including resist features 140 as illustrated in FIG. 2.

The miniaturization of semiconductor devices requires the definition of higher resolution resist patterns having smaller dimensional tolerances and variances. With increasing frequency, the masking processes currently available are being replaced with processes which provide superior resolution and miniaturization of the resist patterns. For example, a dual mask process is disclosed in U.S. Pat. No. 5,851,734 to Pierrat, wherein the use of two masks during a masking process produces better resolution of a desired resist feature than can be accomplished with one mask. In Pierrat, a first resist portion is exposed by a first mask which is used to define one edge of a desired resist feature. A second mask defines the second edge of the desired resist feature. In a positive mask, only that portion of the resist material exposed by both the first and the second mask remains following etching. Similarly, in negative masking, that portion of the resist material which is exposed by both the first and the second mask is removed from the resist layer. This masking technique provides a method whereby smaller resist features can be formed.

In addition to the use of masking processes as described above to create resist patterns for definition of semiconductor device features, masking processes may also be employed to form a layer of protective material over portions of die locations on a semiconductor wafer. For example, a protective material may be deposited in a selected pattern over wire bonds or conductive traces to protect such features from damage or unwanted coating during a particular stage of processing, handling or testing. A portion of a protective material layer covering a semiconductor wafer is exposed, for example, to ultraviolet light through a mask defining the desired protective pattern. The exposed or unexposed portion of the protective material (depending upon its chemical makeup) is then developed and washed from the semiconductor wafer, leaving a pattern of material adhered to the wafer protecting selected locations.

In addition to the trend toward increased miniaturization, another significant consideration in semiconductor device fabrication is process speed. Significant economic advantages may be realized when the rate of production of semiconductor devices fabricated during a given time period is increased. Conventional masking processes require a series of steps including the application of a resist material to a semiconductor substrate such as a wafer, alignment of a mask over the active surface of the wafer, exposure of the resist material to appropriate wavelength radiation through at least one mask to define a desired pattern on the resist, developing of the resist material and rinsing of the excess resist material from the semiconductor wafer. Elimination of a single step in the resist patterning sequence would save substantial time and boost production rates. If the masking step were to be eliminated, not only process time but also the considerable expense of the mask itself would be saved. If the development step were to be eliminated, even further production efficiencies would be realized.

In addition to the cost and relatively slow speed involved in mask placement and alignment, conventional masking of resist material must be effectuated on an entire semiconductor substrate including hundreds or thousands of semiconductor die locations separated by so-called "streets" before the dice are singulated therealong. Thus, alignment must be accurate across an entire substrate such as a wafer, which is proving to be increasingly difficult as feature dimensions shrink, wafers become larger as technology advances (the next generation wafers in development are 30 cm in diameter) and non-planarity of wafer surfaces across the larger wafers becomes more significant to the fabrication process.

The use of lasers in selected aspects of semiconductor fabrication is becoming more common. One use of lasers in semiconductor fabrication is for the marking of a semiconductor package with part numbers, serial numbers, or other information. Laser marking techniques are desirable because of the enhanced efficiency, accuracy and speed of laser marking. The beams of such marking lasers are controlled, manipulated, and triggered to mark the semiconductor only in a specified or programed pattern of indicia. U.S. Pat. No. 5,838,361 to Corbett and U.S. Pat. No. 5,937,270 to Canella each describe exemplary apparatus, methods and techniques used in laser marking of semiconductor chips. The disclosure of each of the Corbett and Canella patents is hereby incorporated herein by reference.

Lasers are also employed in stereolithographic processes used to form layered structures by selectively exposing portions of a photopolymer film to ultraviolet wavelength laser radiation, as disclosed in more detail in the aforementioned U.S. patent applications Ser. Nos. 09/259,142 and 09/259,143. Such processes have been specifically adapted and improved for use in certain aspects of semiconductor fabrication as disclosed in the patent application.

A wide variety of photoresist materials are well known in the art. A resin polymer-based negative photoresist sensitive to near-UV radiation is described in "EPON SU-8: A LOW-COST NEGATIVE RESIST FOR MEMS," Lorenz et al., and "High-aspect-ratio, ultrathick, negative-tone near-UV photoresist and its applications for MEMS," Lorenz et al., *Sensors and Actuators A* 64, pp. 33–39 (1998), the disclosures of each of which are incorporated herein by reference.

It would be advantageous to provide a high speed, accurate, maskless resist patterning process wherein a laser is used to define a pattern in a resist or other protective material on a semiconductor wafer. It would also be advantageous to employ such a process in a manner applicable to partial wafers or even individual semiconductor dice, as desired.

BRIEF SUMMARY OF THE INVENTION

According to the present invention, a method for forming resist or other protective patterns on a substrate is disclosed using exposure of a layer of heat- or selected wavelength-sensitive protective material to a focused, controlled laser or other energy beam comprising electromagnetic radiation traversed over the material layer in a selected path such that portions of the material layer are cured to define a protective pattern over the substrate. As an alternative to traditional masking techniques, the present invention may be used to form patterns of conventional configurations on substrates, such as semiconductor wafers, partial wafers or singulated devices, with at least as great precision and greater repeatability and speed, than is achievable using conventional masking techniques. Furthermore, the present invention may be used to create protective formations over wires and other conductors during semiconductor fabrication without the use of masking techniques.

The method of the present invention involves covering at least a portion of a substrate with a layer of a heat-sensitive or selected wavelength-sensitive protective material, exposing selected portions of the material to a beam of electromagnetic radiation such as a laser beam to completely cure those portions of the material and washing away the uncured portions of the material remaining on the substrate. A precuring step may also be employed to partially cure the entire material layer before exposure of selected portions thereof to the electromagnetic radiation beam. The cured material remaining after developing and/or washing defines the desired protective pattern on the substrate.

In one exemplary embodiment, a layer of EPON Resin SU-8 formulated in solution as a photoresist is deposited on a substrate to a desired thickness and partially cured to a B-stage. Portions of the partially cured resin material are subjected to a traversing laser beam having an appropriate wavelength and energy density sufficient to initiate the cure of the B-stage resin material to a C-stage. Those portions of the partially cured resin material not exposed to the laser beam are removed from the substrate, leaving behind a protective pattern consisting of those portions of the resin material cured to a C-stage.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DESCRIPTION OF THE ILLUSTRATED EMBODIMENTS

The present invention involves the formation of a protective pattern over a substrate. Unlike conventional resist pattern formation processes, the present invention does not involve the use of a mask to create a pattern. Instead, a laser beam, such as those used in semiconductor marking processes, precisely defines the resist or other protective pattern by curing selected portions of a protective material. Removal of the uncured portions of the protective material subsequent to laser beam exposure of the selected portions reveals the protective pattern. Use of a laser instead of a mask provides increased precision, speed and reliability in patterning or protective coating formation processes.

For example, a substrate, such as a semiconductor device, is at least partially covered with a heat setting or selected wavelength-reactive resist material. A laser directs energy in the form of a focused laser beam along a galvanometer-directed path under computer control as known in the art at selected portions of the resist material. The energy of the laser beam cures those portions of the resist material contacted by the laser beam to define a resist feature or pattern of features on the substrate. The portions of the resist material not subjected to the localized energy of the laser beam as it traverses the computer-controlled path may be readily removed by a wash or other conventional residue removal system as known in the art.

Figure 1:
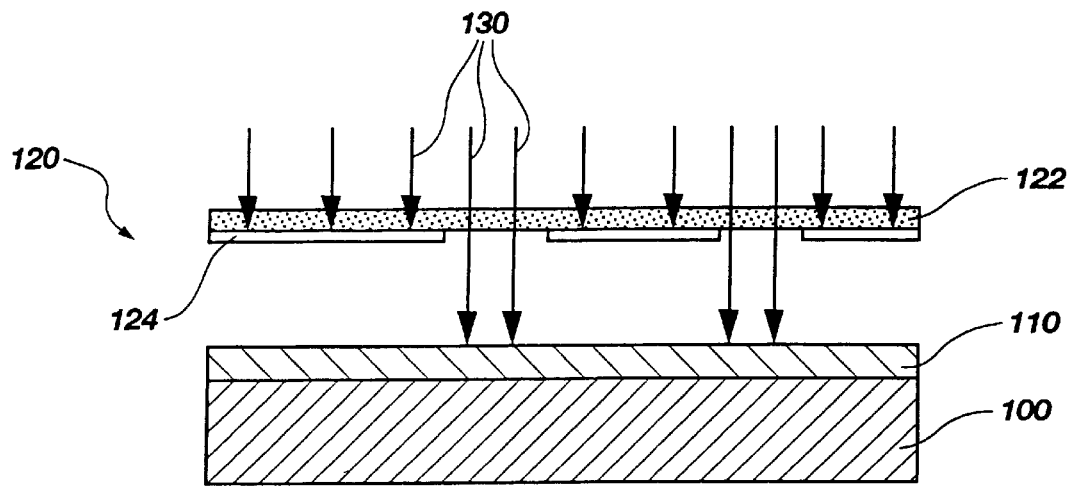
FIG. 1 is a representative cross-sectional illustration of a conventional process for creating a resist pattern on a substrate using a mask.
Figure 2:
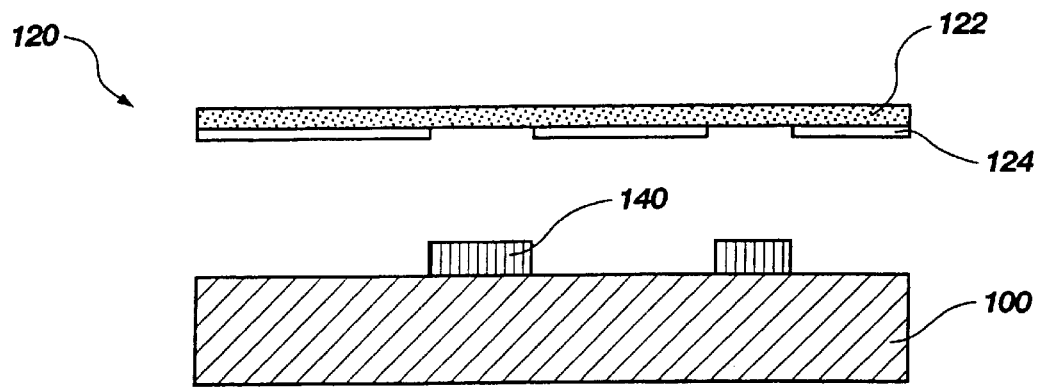
FIG. 2 is a representative cross-sectional illustration of a resist pattern created using the mask and process of FIG. 1.
Figure 3:
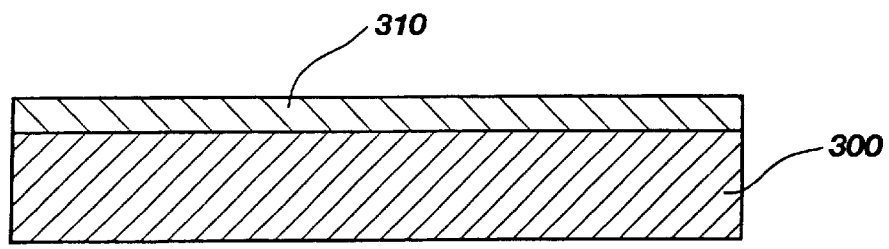
FIG. 3 is a representative cross-sectional illustration of a protective material covering a substrate prior to a patterning process according to the method of the present invention.
Figure 4:
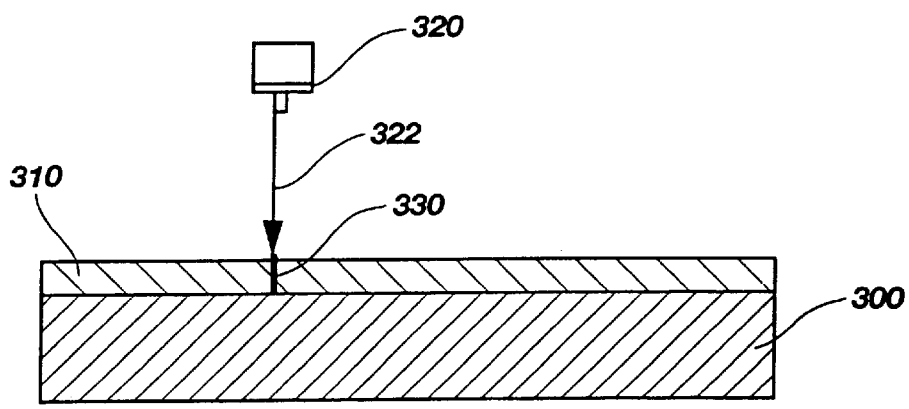
FIG. 4 is a representative cross-sectional illustration of a laser beam selectively curing a portion of protective material covering the substrate as depicted in FIG. 3.
Figure 5:
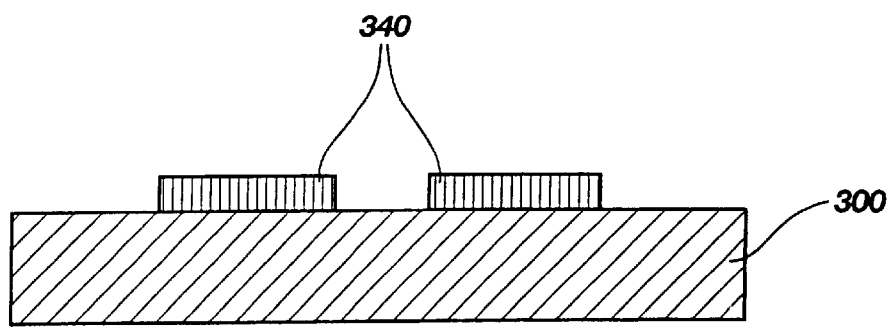
FIG. 5 is a representative cross-sectional illustration of a protective pattern created according to the method of the present invention.

FIGS. 3 through 5 illustrate one exemplary embodiment of the present invention. It should be understood that the figures presented in conjunction with this description are not meant to be actual cross-sectional views of any particular portion of an actual semiconductor device, but are merely idealized representations which are employed to more clearly and fully depict the process of the invention than would otherwise be possible. Furthermore, similar components retain the same numbering scheme throughout the figures.

As illustrated in FIG. 3, a resist material 310 is deposited over a substrate such as a semiconductor device 300. Traditional methods of distributing resist material may be used such as spin-on techniques, spray techniques, rolling techniques, submersion techniques, or otherwise. Although the type of resist material 310 used may depend upon other processing factors (such as intended etch chemicals and heat considerations), any resist material which may be cured by heat or selected wavelength radiation may be employed.

A laser 320 directs at least one laser beam 322 towards resist material 310 as illustrated in FIG. 4. The portion of the resist material 310 exposed to the laser beam 322 is chemically altered to produce a cured portion 330 of the resist material 310. In practice, the laser beam 322 is rapidly traversed across semiconductor device 300 in a selected pattern which may be continuous or discontinuous. In other words, all cured portions 330 of resist material 310 may be physically contiguous, or may comprise discrete islands surrounded by uncured resist material 310. The cured portion 330 of resist material 310 adheres to the semiconductor device 300 and makes up part of the resist pattern 340 on the semiconductor device 300. Once all of the desired portions of the resist material 310 are cured by exposure to laser beam 322, the remaining unexposed and therefore uncured resist material 310 may be washed away or otherwise removed from the semiconductor device 300 using methods known in the art.

FIG. 5 illustrates the semiconductor device 300 of FIGS. 3 and 4 after the uncured resist material 310 is removed from the semiconductor device 300. The cured portions 330 of the resist material 310 remain in place, forming the desired resist pattern 340. Note that the cured portions 330 of the resist material 310 are illustrated as mutually adjacent segments cured by sequential passes of laser beam 322 in the horizontal, or X-Y plane, of the surface of semiconductor device 300.

In another exemplary embodiment of the invention, a layer of protective material is applied to a substrate such as a semiconductor device, covering a surface thereof including selected features to be protected. The protective material, which preferably comprises a resin polymer, may undergo a preferred precuring stage to stabilize same for handling purposes following application to the semiconductor device. The resin polymer may be applied in a liquid-like state, or an A-stage of the resin, to at least a portion of a semiconductor device, by any conventional process such as those previously referenced herein. In the A-stage, wherein the resin polymer is of low molecular weight during which the resin is readily soluble and fusible, it may be readily distributed or flowed across the surface of a semiconductor device using methods as known in the art. Partial curing of the distributed resin polymer converts the resin polymer to a B-stage wherein the resin polymer becomes more viscous, of higher molecular weight and incompletely soluble but plastic. The B-stage is also known as "prepreg." Resin polymer in a prepreg or B-stage is heat fusible. Subjecting portions of the B-stage resin polymer to heat generated by a laser beam cures the B-stage resin polymer to a C-stage, completely polymerizing the resin polymer to a solid, insoluble and infusible state of maximum molecular weight and adhering the resin polymer to the semiconductor device. Any remaining B-stage resin polymer can be removed by methods known in the art, leaving a C-stage resin polymer resist pattern over those portions of the semiconductor device which were exposed to the laser beams.

A preferred resin polymer for use in the inventive process is sold by Shell Chemicals Ltd. through Shell Chemical Company of Houston, Tex. under the tradename "EPON Resin SU-8." EPON Resin SU-8 is a solid, low molecular weight epoxy resin which is useful for fabricating structures having dimensional tolerances in a relatively low range of about 0.25 $\mu$m to about 10 $\mu$m. As employed in the present invention, the EPON Resin SU-8 may be deposited in solution on a semiconductor device in a relatively thick layer, from about 1 mil to about 50 mils. The EPON Resin SU-8 is useful for forming protective patterns of up to at least about 250 $\mu$m (10 mils) thick or more, as desired. Additionally, the EPON Resin SU-8 facilitates the formation of protective patterns having almost vertical sidewalls and is therefore extremely useful in forming pattern features exhibiting high aspect ratios. A high aspect ratio may be defined as characterizing a feature having a height to width ratio of about 4 to 1 or greater. Aspect ratios of greater than 18 to 1 have been achieved with the EPON Resin SU-8 formulated as a photoresist as hereinafter described.

A conventional resist coating apparatus, such as a spin coater, or a meniscus coater, can be used to deposit EPON Resin SU-8, dissolved in a suitable solvent such as gamma-buytrolacton, onto a semiconductor device to a desired thickness. The relative volume of solvent to resin determines the viscosity of the solution and thus the range of available thicknesses for the protective layer to be formed. In order to render the solution photosensitive, a photoinitiator is added in a proportion of about 10% of the weight of the EPON Resin SU-8 mass. A suitable photoinitiator is a triaryl sulfonium salt, the resulting material exhibiting the characteristics of a negative-tone resist.

The deposited resin polymer solution may be spun at low speed using a conventional spin coater to achieve, for example, a 130 $\mu$m thick layer over a wafer. The deposited resin polymer solution may be cured to a B-stage by prebaking the semiconductor device and deposited resist material at about 95° C. for about fifteen minutes.

Selected portions of the B-stage cured resist material are then exposed to a laser beam. The EPON Resin SU-8 may be exposed to a near-UV wavelength (400 nm) laser beam providing an energy level or power density of 165 mJ/cm$^2$ to initiate complete crosslinking of the photoresist. An optional postbake of about 95° C. for about fifteen minutes may be employed to accelerate crosslinking to a C-stage cure. Development of the photoresist may be effected in PGMEA (propylene glycol methyl ether acetate) by dipping or optionally soft rotating agitation therein for about fifteen to thirty minutes, after which the wafer is rinsed with isopropanol. It is believed that smaller features and higher aspect ratios, particularly with respect to openings (for example trenches, or holes) defined in the protective material, may more easily be achieved using spray developing or megasonic bath agitation.

Any remaining unexposed, undeveloped B-stage EPON Resin SU-8 may be removed, or "stripped," with hot NMP (1-methyl-2-pyrrolidinone), an acid solution such as $H_2SO_4/H_2O_2$, fuming $HNO_3$, and/or by $O_2$ ashing. The wafer may then be optionally hard-baked at about 200° C. for about thirty minutes for enhanced resistance to metal etches and solvents as well as RIE (Reactive Ion Etching).

Lasers, such as patterning lasers for stereolithographic processes as well as those used in conventional laser marking processes, for placing identifying indicia on packaged or coated semiconductor dice are generally suitable for use in the present invention. It will be understood and appreciated by those of ordinary skill in the art that different types of protective materials may cure with differing radiation wavelengths and/or power levels or densities, therefore lasers customized or capable of being adjusted to meet the curing requirements of the protective materials chosen are considered to be within the scope of the present invention.

The laser employed in the present invention may be, and preferably is, remotely controlled or automated as known in the art. For example, the laser may be controlled by a computer program resident in the memory of a CPU (Central Processing Unit) or obtained from memory comprising computer readable media. The memory may also store a defined pattern for a resist or other protective pattern including desired features which are communicated to the CPU controlling the laser to create the pattern. The CPU controls the movement of the laser beam using galvanometers to traverse same in its intended path across the coated substrate and initiates the laser to emit a beam at appropriate times during such traversal. In this manner, minute, precise portions of resist or other protective material may be cured using a single laser beam. Repeated, adjacent traversals of the laser beam over target area of resist or other protective material cures larger surface areas thereof to form a pattern which may extend over an entire wafer, a partial wafer, or only a single semiconductor die. Such control allows the lasers used in the present invention to precisely define the boundaries of protective patterns and form simple or complex protective patterns, as desired.

As described in detail in U.S. patent application Ser. No. 09/259,142, a machine vision system may be employed to recognize topographical features on or residing over a surface of a semiconductor substrate so that features to be protected may be easily and quickly identified and protective material disposed thereover may be cured selectively with the laser or other focused energy beam. Use of such machine vision systems facilitates application of the present invention to singulated dice, as such may then be disposed on a support surface for selective laser exposure without the need for mechanical alignment thereof. Of course, machine vision is most effective if the protective material is at least partially transparent so that underlying topographical features may be easily recognized. If machine vision is impractical due to the opaque nature of a particular protective material, known alignment techniques at the wafer level or partial wafer level may be employed.

Figure 6:
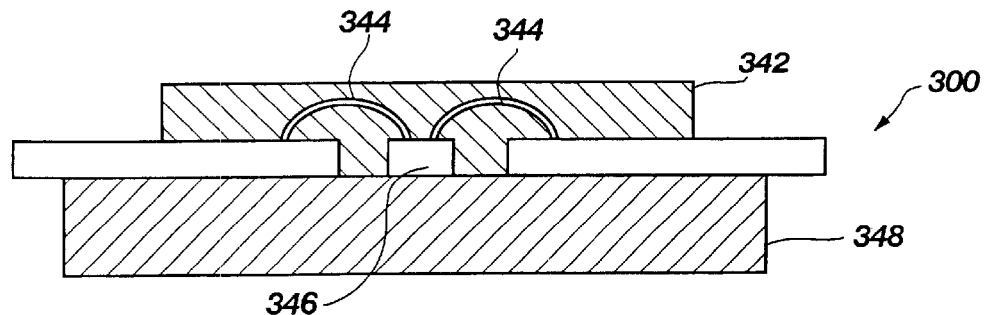
FIG. 6 is a representative cross-sectional illustration of a protective material covering wire bonds formed between bond pads on a semiconductor die and associated leads or traces prior to a patterning process according to the method of the present invention.
Figure 7:
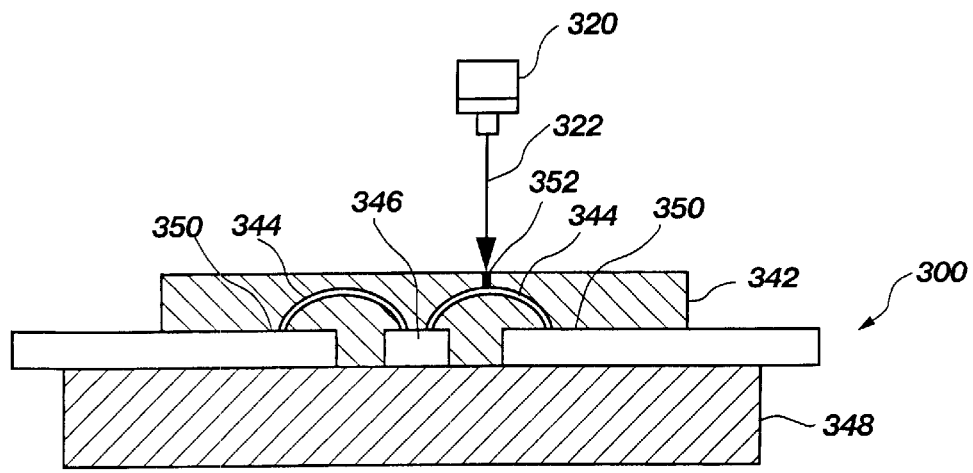
FIG. 7 is a representative cross-sectional illustration of a laser beam selectively curing a portion of protective material covering the wire bonds as depicted in FIG. 6.
Figure 8:
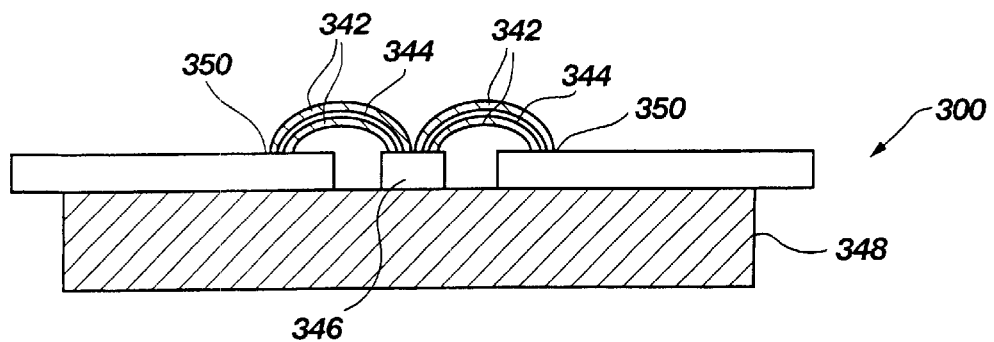
FIG. 8 is a representative cross-sectional illustration of a protective pattern created according to the method of the present invention.

In another exemplary embodiment of the present invention, a laser 320 is used to cure a protective coating 342, such as the aforementioned EPON Resin SU-8 formulated as described above, over wire bond locations on the active surface of a semiconductor device 300. The same method as described above is used, except the protective material is used to encapsulate the delicate wire bonding. For example and as is well known in the art, in a conventional leadframe semiconductor die assembly, a leads-over-chip (LOC) assembly, a chip-on-board (COB) assembly, and a board-on-chip assembly, wire bonds 344 are formed between bond pads 346 on a semiconductor die 348 and associated leads or traces 350 to provide external connections from the die to other dice and to higher level packaging. To protect the wire bonds 344 from damage, a protective material 342, such as EPON Resin SU-8, may be applied or distributed over and between the wire bonds 344 between and to the extremities thereof as shown in FIG. 6. The protective material 342 may then be partially cured to a B-stage and a laser 320 used to direct a laser beam 322 to produce fully cured portions 352 of EPON Resin SU-8 disposed over and optionally around the wire bonds 344. Once the fully cured portions 352 of protective material 342 around the wire bonds 344 are cured to a C-stage, as shown in FIG. 7, the remaining protective material 342 may be removed. The result, as shown in FIG. 8, is a semiconductor die assembly wherein the wire bonds 344 between the bond pads 346 on the semiconductor die 348 and associated leads or traces 350 of the carrier, such as a lead frame or printed circuit board, are protected and physically supported by a cured layer of resist material as patterned.

In similar fashion to patterning approaches discussed above, dams or fences of the aforementioned EPON Resin SU-8 photoresist formula may be selectively formed on a semiconductor device as well as carrier substrate surfaces to constrain spread of flowable encapsulating materials such as silicone gels.

As used herein, the term "pattern" is contemplated to include and encompass not only patterns comprising contiguous segments of protective material but also isolated segments or islands thereof completely separated from other segments, as well as combinations of contiguous segments and islands of protective material.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A method of forming a pattern of protective material on a semiconductor device surface, comprising:
providing a semiconductor device having an exposed surface;
applying a single protective material to at least a portion of said exposed surface;
modifying said single protective material to a partially cured state;
exposing selected portions of said partially cured single protective material to a focused energy beam to initiate complete curing of said exposed, selected portions of said partially cured single protective material; and
removing any remaining portions of said partially cured single protective material from said exposed surface.

2. The method of claim 1, wherein said applying a single protective material to at least a portion of said exposed surface comprises applying an electromagnetic wavelength-sensitive material thereto.

3. The method of claim 1, wherein said applying a single protective material to at least a portion of said exposed surface comprises applying EPON Resin SU-8 thereto.

4. The method of claim 1, wherein said applying a single protective material to at least a portion of said exposed surface comprises applying a heat-sensitive material thereto.

5. The method of claim 1, wherein said modifying said single protective material to a partially cured state comprises curing a resin material to a B-stage.

6. The method of claim 5, wherein said initiating complete curing of said exposed, selected portions of said partially cured single protective material comprises initiation of curing said B-stage resin material to a C-stage.

7. The method of claim 1, wherein said exposing selected portions of said partially cured single protective material to a focused energy beam comprises exposing portions of said partially single cured protective material to a laser beam of appropriate wavelength to initiate a full cure of those portions of said partially cured single protective material exposed to said laser beam.

8. The method of claim 1, wherein said exposing selected portions of said partially cured single protective material to a focused energy beam comprises exposing portions of said partially cured single protective material to a laser beam having sufficient power density to initiate a full cure of those portions of said partially cured single protective material exposed to said laser beam.

9. A method of forming a pattern of protective material on a substrate, comprising:
   providing a substrate having an exposed surface;
   applying a single layer of protective material to at least a portion of said exposed surface;
   exposing selected portions of said single layer of protective material to a focused energy beam to cure and define a protective pattern; and
   removing only those portions of said single layer of protective material not exposed to said focused energy beam.

10. The method of claim 9, wherein said applying a single layer of protective material to at least a portion of said exposed surface comprises applying EPON Resin SU-8 to said at least a portion of said exposed surface.

11. The method of claim 9, wherein said providing a substrate comprises providing a substrate including at least a layer of semiconductor material.

12. The method of claim 9, further comprising:
   modifying said single layer of protective material to a partially cured state before said exposing selected portions of said single layer of protective material to said focused energy beam.

13. The method of claim 12, wherein said modifying said single layer of protective material to a partially cured state comprises curing a resin material to a B-stage.

14. The method of claim 13, wherein said exposing selected portions of said single layer of protective material to a focused energy beam comprises initiating a cure of said resin material to a C-stage.

15. The method of claim 9, wherein said exposing selected portions of said single layer of protective material to a focused energy beam further comprises:
   providing a computer;
   operably coupling an energy beam source to said computer; and
   controlling emission of said focused energy beam from said energy beam source and a path of said focused energy beam across said exposed surface of said substrate with said computer.

16. The method of claim 9, wherein said applying a single layer of protective material to at least a portion of said exposed surface comprises applying a resist material.

17. The method of claim 16, wherein said applying said resist material comprises applying a photoresist.

18. A method of protecting a wire bond on a semiconductor device, comprising:
   providing a semiconductor device having at least one wire bond thereon;
   disposing a resin polymer over at least a portion of said semiconductor device including said at least one wire bond thereon;
   exposing said resin polymer disposed over said at least one wire bond to a focused energy beam to initiate a cure thereof; and
   removing any portion of said resin polymer not exposed to said focused energy beam.

19. The method of claim 18, wherein said disposing a resin polymer over at least a portion of said semiconductor device comprises applying EPON Resin SU-8 over said at least a portion of said semiconductor device.

20. The method of claim 18, wherein said exposing said resin polymer disposed over said at least one wire bond to a focused energy beam comprises exposing said resin polymer disposed over said at least one wire bond to a laser beam.

21. The method of claim 18, wherein said exposing said resin polymer disposed over said at least one wire bond to a focused energy beam comprises exposing said resin polymer disposed over said at least one wire bond to a laser beam of a wavelength sufficient to initiate the cure of said resin polymer.

22. The method of claim 18, wherein said exposing said resin polymer disposed over said at least one wire bond to a focused energy beam comprises exposing said resin polymer disposed over said at least one wire bond to a laser beam exhibiting a sufficient power density to initiate the cure of said resin polymer.

23. The method of claim 18, further comprising:
   modifying said resin polymer to a partially cured state before said exposing said resin polymer disposed over said at least one wire bond to said focused energy beam.

24. The method of claim 23, wherein said modifying said resin polymer to a partially cured state comprises curing said resin polymer to a B-stage.

25. The method of claim 23, wherein said modifying said resin polymer to a partially cured state comprises curing said resin polymer to a prepreg state.

* * * * *

UNITED STATES PATENT AND TRADEMARK OFFICE
CERTIFICATE OF CORRECTION

PATENT NO. : 6,544,902 B1
DATED : April 8, 2003
INVENTOR(S) : Warren M. Farnworth It is certified that error appears in the above-identified patent and that said Letters Patent is hereby corrected as shown below:

Title page,
Item [56], References Cited, U.S. PATENT DOCUMENTS, before "11/1993" delete "*"; and after "5,705,117 A" delete "*"

Column 8,
Line 15, insert a comma after "thereof"

Signed and Sealed this

Eighth Day of March, 2005

JON W. DUDAS
*Director of the United States Patent and Trademark Office*